(12) United States Patent
Ide et al.

(10) Patent No.: US 9,012,902 B2
(45) Date of Patent: Apr. 21, 2015

(54) ORGANIC ELECTROLUMINESCENT ELEMENT

(75) Inventors: Nobuhiro Ide, Osaka (JP); Norihiro Ito, Osaka (JP); Hiroya Tsuji, Kyoto (JP); Yuko Suzuka, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/007,440

(22) PCT Filed: Mar. 9, 2012

(86) PCT No.: PCT/JP2012/056143
§ 371 (c)(1),
(2), (4) Date: Sep. 25, 2013

(87) PCT Pub. No.: WO2012/132842
PCT Pub. Date: Oct. 4, 2012

(65) Prior Publication Data
US 2014/0014937 A1 Jan. 16, 2014

(30) Foreign Application Priority Data
Mar. 31, 2011 (JP) .................... 2011-080910

(51) Int. Cl.
*H01L 51/50* (2006.01)
*H01L 51/52* (2006.01)

(52) U.S. Cl.
CPC ........ *H01L 51/5008* (2013.01); *H01L 51/5044* (2013.01); *H01L 51/5278* (2013.01)

(58) Field of Classification Search
CPC .................................. H01L 51/5008
USPC .................. 257/40, 98, E51.019; 313/504
See application file for complete search history.

(56) References Cited

U.S. PATENT DOCUMENTS

| 6,717,358 B1 | 4/2004 | Liao et al. |
| 7,728,517 B2 | 6/2010 | Aziz et al. |

(Continued)

FOREIGN PATENT DOCUMENTS

| JP | 2003-272860 | 9/2003 |
| JP | 2004-281371 | 10/2004 |

(Continued)

OTHER PUBLICATIONS

International Search Report (ISR) and Written Opinion (WO) in International Application No. PCT/JP2012/056143, dated Jun. 12, 2012.

(Continued)

*Primary Examiner* — Phuc Dang
(74) *Attorney, Agent, or Firm* — Greenblum & Bernstein, P.L.C.

(57) ABSTRACT

Provided is an organic electroluminescent element superior in long-term durability and lifetime characteristics. The organic electroluminescent element has a structure where plurality of light-emitting layers formed via an intermediate layer are interposed between a positive electrode and a negative electrode. The intermediate layer has a mixed layer, a first layer, and a hole-injection layer which are formed in this order from the positive electrode to the negative electrode, the mixed layer containing an electron-donating substance and an electron-transporting organic material, and the first layer being made of an electron-transporting material. The first layer has a thickness in a range of 0.2 to 2.0 nm. The hole-injection layer consists of an electro-accepting organic material.

16 Claims, 2 Drawing Sheets

(56) References Cited

U.S. PATENT DOCUMENTS

| | | |
|---|---|---|
| 7,736,754 B2 | 6/2010 | Kijima et al. |
| 7,955,719 B2 | 6/2011 | Hatwar et al. |
| 7,985,974 B2 | 7/2011 | Nowatari et al. |
| 8,080,934 B2 | 12/2011 | Kido et al. |
| 8,207,540 B2 | 6/2012 | Nowatari et al. |
| 8,373,191 B2 | 2/2013 | Ide et al. |
| 8,431,940 B2 | 4/2013 | Nowatari et al. |
| 8,482,193 B2 | 7/2013 | Kido et al. |
| 8,492,184 B2 | 7/2013 | Nishiyama et al. |
| 8,492,754 B2 | 7/2013 | Nishiyama et al. |
| 2003/0189401 A1 | 10/2003 | Kido et al. |
| 2006/0220534 A1 | 10/2006 | Shibanuma et al. |
| 2006/0263629 A1 | 11/2006 | Aziz et al. |
| 2007/0181887 A1 | 8/2007 | Kijima et al. |
| 2007/0182317 A1 | 8/2007 | Kido et al. |
| 2007/0221912 A1 | 9/2007 | Jeong et al. |
| 2009/0191428 A1 | 7/2009 | Hatwar et al. |
| 2010/0133573 A1 | 6/2010 | Nowatari et al. |
| 2011/0127561 A1 | 6/2011 | Ide et al. |
| 2011/0215714 A1* | 9/2011 | Seo et al. ............... 313/504 |
| 2011/0260156 A1 | 10/2011 | Nowatari et al. |
| 2012/0119194 A1 | 5/2012 | Nagai et al. |
| 2012/0132895 A1 | 5/2012 | Kido et al. |
| 2012/0228589 A1* | 9/2012 | Mitsuya ................... 257/40 |
| 2012/0235166 A1 | 9/2012 | Nowatari et al. |
| 2013/0228766 A1 | 9/2013 | Nowatari et al. |

FOREIGN PATENT DOCUMENTS

| | | |
|---|---|---|
| JP | 2005-135600 | 5/2005 |
| JP | 2006-049393 | 2/2006 |
| JP | 2006-140275 | 6/2006 |
| JP | 2006-173550 | 6/2006 |
| JP | 2006-332048 | 12/2006 |
| JP | 2006-351398 | 12/2006 |
| JP | 2007-179933 | 7/2007 |
| JP | 2010-034042 | 2/2010 |
| JP | 2010-056077 | 3/2010 |
| JP | 2011-009688 | 1/2011 |
| JP | 2011-096406 | 5/2011 |
| WO | 2009/097084 | 8/2009 |
| WO | 2011/010696 | 1/2011 |

OTHER PUBLICATIONS

"Multiphoton organic EL devices for illumination," Meeting of Research Group on Electrical and Electronic Properties of Polymer and Organics, Society of Polymer Science, p. 1 (Dec. 9, 2005), along with an English language translation thereof.

English language tranlation of Search Report for Taiwanese Patent Application No. 101108157, dated Oct. 20, 2014.

* cited by examiner (a)

(b)

US 9,012,902 B2

ORGANIC ELECTROLUMINESCENT ELEMENT

TECHNICAL FIELD

The present invention relates to an organic electroluminescent element available for light sources for lighting use, backlights for liquid crystal displays, flat panel displays and others.

BACKGROUND ART

A known example of organic light-emitting elements, so-called organic electroluminescent elements, is an element that has a transparent electrode serving as a positive electrode, a hole-transporting layer, a light-emitting layer (organic light-emitting layer), an electron-injection layer, and an electrode serving as a negative electrode stacked in this order on a surface of a transparent substrate. When voltage is applied between the positive and negative electrodes, the electrons injected into the light-emitting layer via the electron-injection layer and the holes injected into the light-emitting layer via the hole-transporting layer recombines with each other, and this recombination causes light in the light-emitting layer, and the light generated in the light-emitting layer travels outwards through the transparent electrode and the transparent substrate.

Such an organic electroluminescent element is characterized, for example, in that it is self-luminous and that the element shows relatively high-efficiency emission characteristics and permits emission of light in various color tones. Specifically, their use is highly expected as light emitters in display devices, such as flat panel displays or as light sources, for example, as backlights for liquid crystal displays and lighting and some of them are already commercialized.

Such an organic electroluminescent element has a trade-off between the luminance and the lifetime. Thus, intensive developments aimed at an organic electroluminescent element that retains its lifetime unaffected even when the luminance of light is increased to obtain a more brilliant image and or to obtain brighter light are in progress. Specifically, there have been proposed organic electroluminescent elements in which multiple light-emitting layers are interposed between positive and negative electrodes and the light-emitting layers are electrically connected (see, for example, Patent Documents 1 to 6).

FIG. 4 shows an example of the structure of such an organic electroluminescent element. A plurality of light-emitting layers 4a and 4b are formed between an electrode serving as a positive electrode 1 and an electrode serving as a negative electrode 2. The plurality of light-emitting layers 4a and 4b are stacked such that an intermediate layer 3 is interposed between the neighboring light-emitting layers 4a and 4b. This laminated structure is placed on a surface of a transparent substrate 5. The positive electrode 1 is formed as a light-transmitting electrode, while the negative electrode 2 is formed as a light-reflecting electrode. An electron-injection layer and a hole-transporting layer formed on both sides of the light-emitting layers 4a and 4b are not shown in FIG. 4.

In such a configuration, the intermediate layer 3 is interposed between the plurality of light-emitting layers 4a and 4b so as to electrically connecting them to each other. When voltage is applied between the positive electrode and the negative electrode, the plurality of light-emitting layers 4a and 4b emit light simultaneously as if they are connected in series with each other. Since light emitted from the organic electroluminescent element is a total of light emitted from respective light-emitting layers 4a and 4b in this case. Hence, when a constant current is supplied, luminance is higher in this organic electroluminescent element than that in a conventional organic electroluminescent element. Thus, the problem of the trade-off between the luminance and the lifetime can be solved.

Examples of known common configurations of the intermediate layer 3 include, for example, (1) $BCP:Cs/V_2O_5$, (2) $BCP:Cs/NPD:V_2O_5$, (3) in-situ reaction products of a Li complex and Al, (4) Alq:Li/ITO/hole-transporting materials, (5) mixed metal-organic layers, (6) oxides of alkali metals and alkali-earth metals, (7) laminates of N-doped layer/metal oxide layer/P-doped layer and the like. In the formulae above, the character ":" means a mixture of two materials, while the character "/" means a laminate of the two former and latter compositions.

PRIOR ART DOCUMENTS

Patent Literature

Patent Document 1: JP 2003-272860 A
Patent Document 2: JP 2005-135600 A
Patent Document 3: JR 2006-332048 A
Patent Document 4: JP 2006-173550 A
Patent Document 5: JP 2006-49393 A
Patent Document 6: JP 2004-281371 A

SUMMARY OF THE INVENTION

Problems to be Resolved by the Invention

However, as described above, installation of an intermediate layer separating multiple light-emitting layers may lead to an increase in operation voltage and an undesired increase in voltage, and also may cause defects such as short circuits due to deterioration in film quality.

Specifically in the case of the intermediate layer of the type (1), there is a concern about the defects caused by short circuits due to the poor quality of the $V_2O_5$ layer.

Further in the case of the type (2), there may be a problem of increase in voltage caused by the side reactions between the two layers. For example, it was reported that Lewis acid molecules react with the electron-transporting material and alkali metals react with the hole-transporting material as Lewis bases, leading to increase of operation voltage (see "Multiphoton organic EL devices for illumination," meeting of Research Group on Electrical and Electronic Properties of Polymer and Organics, Society of Polymer Science, on Dec. 9, 2005).

Furthermore in the case of the type (3), there is occasionally a problem that the organic ligand component of a Li complex used for obtaining an in-situ reaction product exerts adverse effects on the element characteristics.

Moreover in the case of the type (4), hole injection from ITO as an intermediate layer to the hole-transporting material is not always favorable, occasionally this leading to problems on operation voltage and element characteristics. Further, since the specific resistance of ITO is smaller, electric charges may migrate on the ITO surface to the places where no emission is desired, leading to light emission from regions other than desired luminescent region.

Additionally in the case of the type (5), since the intermediate layer is prepared by mixing an organic matter with a metal including a metal compound such as metal oxide, there has been a concern about deterioration of the thermal stability of the intermediate layer and thus degradation of the intermediate layer especially when large current is applied thereto.

In addition in the case of the type (6), the performance of the intermediate layer of a metal oxide containing an alkali or alkali-earth metal is not completely sufficient. Thus, it is practically needed to use a layer of a substance other than the metal oxide containing an alkali or alkali-earth metal, as it is laminated, making the structure of the intermediate layer more complicated and making it difficult to produce the layer.

In the case of the type (7), it is disclosed that a layer for preventing diffusion of a metal oxide is formed for prevention of mutual diffusion of the P and N dopants in the intermediate layer. However, from the viewpoint of OLED design, installation of a layer made only of a metal oxide as the intermediate layer is equivalent to addition of a component having a refractive index higher than the principal organic matter in the OLED. There is formed a large discontinuity (difference of 0.2 or more) in refractive index in the intermediate region in this case, leading, from the optical viewpoints, to increase of optical interference due to the difference in refractive index and thus making it difficult to design optical devices. Accordingly, such a system is not desirable from the point of emission characteristics such as emission efficiency.

Further in the cases of the types (1) and (4), there is a possibility that defects around the intermediate layer may be amplified by the stress in the film constituting the intermediate layer, especially when the organic electroluminescent device is a large-area device.

Organic electroluminescent elements having multiple light-emitting layers laminated via intermediate layers have various problems such as durability and lifetime, as described above, and there is currently a need for an intermediate layer that overcomes these problems.

In view of the above problems, the present invention has aimed to provide an organic electroluminescent element that has an improved intermediate layer and is thus superior in long-term durability and lifetime characteristics.

Means of Solving the Problems

The organic electroluminescent element according to the present invention is an organic electroluminescent element having a structure where plurality of light-emitting layers formed via an intermediate layer are interposed between positive and negative electrodes. The intermediate layer has a mixed layer, a first layer and hole-injection layer which are formed in this order from the positive electrode to the negative electrode. The mixed layer containing an electron-donating substance and an electron-transporting organic material. The first layer is made of electron-transporting organic material. The first layer has a thickness in a range of 0.2 to 20 nm; and the hole-injection layer consists of an electron-accepting organic material.

The electron-accepting organic material is preferably 1,4,5,8,9,11-hexaazatriphenylene-hexacarbonitrile.

The organic electroluminescent element preferably further includes a second layer made of electron-transporting organic material formed between the positive electrode and the mixed layer. The electron-transporting organic material contained in the mixed layer, the electron-transporting organic material forming the first layer, and the electron-transporting organic material forming the second layer are the same material.

In addition, the organic electroluminescent element according to the present invention is an organic electroluminescent element having a structure where plurality of light-emitting layers formed via an intermediate layer are interposed between positive and negative electrodes. The intermediate layer has an electron-injection layer and a hole-injection layer formed in this order from the positive electrode to the negative electrode. The electron-injection layer contains an electron-donating substance and electron-transporting organic material. When contents of the electron-donating substance and the electron-transporting organic material are designated respectively as C1 and C2, the value of C1/C2 becomes greater toward a central region than at ends respectively close to the positive electrode and the negative electrode with regard to the intermediate layer.

Advantageous Effects of Invention

It is possible according to the present invention to suppress direct reaction of the mixed layer containing an electron-donating substance and an electron-transporting organic material with the hole-injection layer and to inhibit mixing of the interface between the mixed layer and the hole-injection layer and diffusion of materials between the layers during operation. It is thus possible to obtain an organic electroluminescent element superior in long-term durability and lifetime characteristics.

BRIEF DESCRIPTION OF DRAWINGS

FIG. 3(a) is the top view, while FIG. 3(b) is the cross-sectional view taken along line A-A' in FIG. 3(a).

DESCRIPTION OF EMBODIMENTS

Hereinafter, favorable embodiments of the invention will be described.

Figure 1:
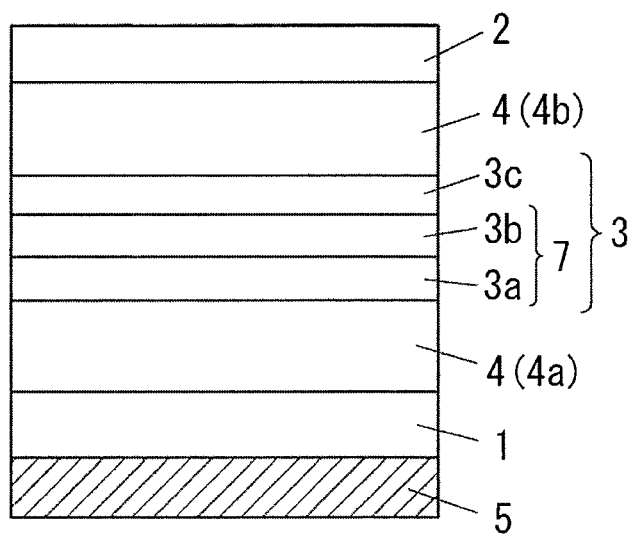
FIG. 1 is a schematic cross-sectional view illustrating the layer structure of an organic electroluminescent element in an embodiment of the present invention.

FIG. 1 shows the layer structure of an organic electroluminescent element according to the present invention, in which light-emitting layers (also called organic light-emitting layers) 4 and an intermediate layer 3 are formed between an electrode serving as a positive electrode 1 and an electrode serving as a negative electrode 2. The light-emitting layers 4 includes a plurality of light-emitting layers 4a and 4b, the plurality of light-emitting layers 4a and 4b are stacked in a direction in which the positive electrode 1 and the negative electrode 2 are stacked, and the intermediate layer 3 is interposed between the adjacent light-emitting layers 4a and 4b. In addition, one electrode (the positive electrode 1 in FIG. 1) is disposed on the surface of a transparent substrate 5. In the present embodiment, the positive electrode 1 is formed as a light-transmitting electrode, while the negative electrode 2 as a light-reflecting electrode.

Although the two light-emitting layers 4a and 4b are formed as the light-emitting layers 4 via the intermediate layer 3 in the embodiment shown in FIG. 1, one or more additional light-emitting layers 4 may be stacked while one or more additional intermediate layers 3 are interposed therein. The number of light-emitting layers 4 stacked is not particularly limited but, as increase in the number of layers leads to increased complexity in optical and electrical element designs. Hence, the number of light-emitting layers 4 stacked is preferably 5 or less. Similarly to common organic electroluminescent elements, an intermediate layer and also, as needed, a hole-injection layer, a hole-transporting layer, an electron-transporting layer, an electron-injection layer or the like (these layers are not shown in FIG. 1) may be formed between the light-emitting layer 4a or 4b and the positive electrode 1 or the negative electrode 2.

As shown in FIG. 1, in the organic electroluminescent element according to the present invention, the intermediate layer 3 constituted by a mixed layer 3a, a first layer 3b of an electron-transporting organic material, and a hole-injection layer 3c formed as stacked in this order from the positive electrode 1 to the negative electrode 2.

As described above, the mixed layer 3a is a layer containing an electron-donating substance and an electron-transporting organic material, which has a function of injecting electrons.

The electron-donating substance contained in the mixed layer 3a is not particularly limited, but, for example, a metal having a work function of 3.7 eV or less may be used. Typical examples thereof include alkali, alkali-earth and rare-earth metals such as cerium, lithium, sodium, magnesium, potassium, rubidium, samarium, yttrium, and cesium, perylene, TTF (tetrathiafulvalene), TTT (tetrathionaphthacene), tetrakis(1,3,4,6,7,8-hexahydro-2H-pyrimido[1,2-a]pyrimidine) ditungsten (II) described in JP 2009-521109 A and the like.

The electron-transporting organic materials contained in the mixed layer 3a include, for example, 2,9-dimethyl-4,7-diphenyl-1,10-phenanthroline (BCP), tris(8-hydroxyquinolinato) aluminum complex (Alq3), bis(2-methyl-8-quinolinate)-4-(phenylphenolato) aluminum complex (BAlq), phenanthroline derivatives, pyridine derivatives, tetrazine derivatives, oxadiazole derivatives and the like.

The thickness of the mixed layer 3a is not particularly limited, but preferably 0.5 to 20 nm. The mixed layer 3a shows its function sufficiently when the thickness is in the range above.

The content of the electron-donating substance in the mixed layer 3a is preferably 5 to 50 mol % with respect to the entire mixed layer 3a, while the content of the electron-transporting organic material is preferably 95 to 50 mol % with respect to the entire mixed layer 3a. When the contents are in the ranges above, it is possible to suppress more effectively the direct reaction between the mixed layer 3a and the hole-injection layer 3c described below. It is also possible to more effectively inhibit mixing of the interface between the mixed layer 3a and the hole-injection layer 3c and diffusion of materials between the layers during operation.

The electron-donating substance contained in the mixed layer 3a may be mixed mostly uniformly in the entire mixed layer 3a or may be mixed or laminated in particular regions of the mixed layer 3a, for example a region close to the intermediate region of 3a or a region close to the interface with the neighboring a first layer 3b of an electron-transporting organic material. It is possible in these configurations to make the properties of the mixed layer 3a, which are required as the intermediate layer 3 according to the present invention, expressed by the interaction between the electron-donating substance and the electron-transporting organic material constituting the mixed layer 3a.

Examples of the electron-transporting organic materials for use in the first layer 3b include those described for the electron-transporting organic material contained in the mixed layer 3a.

The first layer 3b, which is an electron-transporting layer, has a thickness of 0.2 to 20 nm. It is possible, when the thickness of the first layer 3b is in the range above, to suppress the direct reaction between the mixed layer 3a and the hole-injection layer 3c and to inhibit mixing of the interface between the layers 3a and 3c and diffusion of materials between the layers during operation. It is thus possible to obtain an organic electroluminescent element superior in long-term durability and lifetime characteristics and to obtain an organic electroluminescent element that has a lower operation voltage and is superior in long-term durability and lifetime characteristics especially by controlling the thickness more strictly. The thickness of the first layer 3b is more preferably 0.5 to 5 nm, particularly preferably 2 to 5 nm.

On the other hand, the hole-injection layer 3c is preferably made only of an electron-accepting organic material (also called Lewis acid). The electron-accepting organic material in the hole-injection layer 3c is not particularly limited, but may be, for example, a pyrazine derivative represented by the structural formula of [Formula 1].

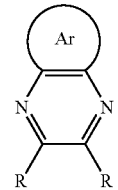

[Formula 1]

(wherein, Ar represents an aryl group, and R represents a hydrogen atom, an alkyl, alkyloxy or dialkylamine group having a carbon number of 1 to 10, F, Cl, Br, I or CN.)

The electron-accepting substance of the hole-injection layer is particularly preferably a hexaazatriphenylene derivative represented by the structural formula of [Formula 2].

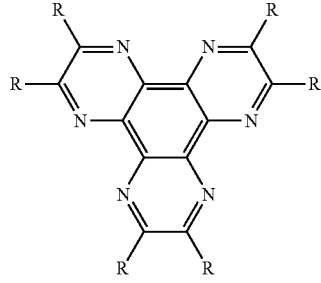

[Formula 2]

(wherein, R represents a hydrogen atom, an alkyl, alkyloxy or dialkylamine group having a carbon number of 1 to 10, F, Cl, Br, I or CN.)

The thickness of the hole-injection layer 3c is not particularly limited, but preferably is selected from the range of about 0.5 to 20 nm, as it is possible to assure and adjust the hole-injecting efficiency properly when the thickness is in the range above.

When the absolute value of the difference between the LUMO1 of the electron-transporting organic material forming the first layer 3b and the LUMO2 of the electron-accepting organic material forming the hole-injection layer 3c (|LUMO1-LUMO2| is the absolute value) is smaller, it is possible to transport the electrons provided from the hole-injection layer 3c to the mixed layer 3a more efficiently. Thus, the value of |LUMO1-LUMO2| is preferably 1.5 eV or less, particularly preferably 0.8 eV or less. From the viewpoint above, a combination of the first layer 3b, for example, of BCP (LUMO: −3.2 eV) and the hole-injection layer 3c, for example, of 1,4,5,8,9,11-hexaazatriphenylene-hexacarbonitrile (LUMO: −4.0 eV) represented by the structural formula of [Formula 3] is particularly preferable, as the value of |LUMO1-LUMO2| is smaller.

[Formula 3]

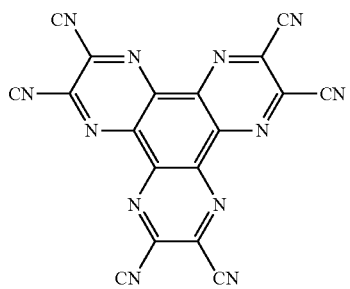

As described above, in preparation of an intermediate layer 3 having a mixed layer 3a, a first layer 3b and a hole-injection layer 3c, first, a mixed layer 3a containing an electron-donating substance and an electron-transporting organic material is formed on the light-emitting layer 4 that one of the light-emitting layers 4 and is close to the positive electrode 1. A first layer 3b made of an electron-transporting organic material is then formed on the surface of the mixed layer 3a and a hole-injection layer 3c made of a hole-injecting material is formed additionally on the surface of the first layer 3b. The process for forming the mixed layer 3a, the first layer 3b, and the hole-injection layer 3c is not particularly limited, but a vacuum deposition method is preferable, as it permits high-accuracy control of thickness. When an electron-transporting layer for example is formed on the surface of the light-emitting layer 4, the intermediate layer 3 is formed on the light-emitting layer 4 while the electron-transporting layer is interposed between the intermediate layer 3 and the light-emitting layer 4.

Any materials known as the materials for organic electroluminescent elements may be used as the materials for the light-emitting layer 4. Examples thereof include, but are not limited to, anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, quinoline metal complexes, tris(8-hydroxyquinolinato) aluminum complex (Alq3), tris(4-methyl-8-quinolinato) aluminum complex, tris(5-phenyl-8-quinolinato) aluminum complex, aminoquinoline metal complexes, benzoquinoline metal complexes, tri-(p-terphenyl-4-yl)amine, 1-aryl-2,5-di(2-thienyl)pyrrole derivatives, pyran, quinacridone, rubrene, distyrylbenzene derivatives, distyrylarylene derivatives, distyrylamine derivatives, various fluorescent colorants, those materials described above, and the derivatives thereof. Light-emitting materials selected from these compounds may be used, as they are combined adequately. Besides the fluorescent compounds such as those described above, materials that emit light from spin multiplet, such as phosphorescent materials that emit phosphorescent light, and compounds containing such a unit in the molecule can also be used favorably. The organic layer of such a material may be formed by a dry process such as vapor deposition or transfer or by a wet process such as spin coating, spray coating, die coating, or gravure printing. In the embodiment shown in FIG. 1, the plurality of light-emitting layers 4a and 4b may be made of the same material or different materials.

The thickness of the light-emitting layer 4 is not particularly limited, but preferably 0.5 to 20 nm.

Materials that have been commonly used may be used, as they are, for other components constituting the organic electroluminescent element of FIG. 1, i.e., the substrate 5 holding the laminated element, the positive electrode 1, the negative electrode 2 and others.

Specifically, the substrate 5 is made of a light-transmitting material, if the substrate 5 is required to pass light. In this case, the substrate 5 may be transparent and colorless, slightly colored or obscured like ground glass. Examples of the substrates include transparent glass plates such as soda lime glass and nonalkali glass and plastic films and plates prepared by any method from resins such as polyester, polyolefin, polyamide and epoxy resins, fluorine resins and others. In addition, a substrate 5 having a light-diffusing action, which is prepared for example by adding particles, powders or foams different in refractive index to the substrate 5 or by providing a shape on the surface, may also be used. When the light is emitted not through the substrate 5, the substrate 5 may not permit light transmission. Any substrate 5 may be used, provided that the emission characteristics, lifetime characteristics and others of the element are not impaired. In particular, a highly heat-conductive substrate 5 may be used for suppression of the temperature rise of the element by the heat generated during operation.

The positive electrode 1, which is an electrode for injecting holes into the organic light-emitting layer 4, is preferably made of an electrode material selected from metal, alloy, electrically conductive compound higher in work function and a mixture thereof. It is more preferable that Use of an electrode material having a work function of 4 eV or more. Examples of the materials for the positive electrode 1 include metals such as gold; CuI, ITO (indium-tin oxide), SnO$_2$, ZnO, IZO (indium-zinc oxide), conductive polymers such as PEDOT and polyaniline; conductive polymers doped for example with an arbitrary acceptor; and conductive light-transmitting materials such as carbon nanotube.

The positive electrode 1 can be prepared, for example, by forming a thin film of made of at least one of these electrode materials on the surface of the substrate 5 by a method such as vacuum deposition, sputtering or coating. To allow light generated in the organic light-emitting layer 4 to travel outward through the positive electrode 1, the positive electrode 1 preferably has a light transmittance of 70% or more. The positive electrode 1 preferably has a sheet resistance of several hundreds Ω/□ or less, particularly preferably 100Ω/□ or less. The thickness of the positive electrode 1 is preferably selected from the range of 500 nm or less, more preferably from the range of 10 to 200 nm, although it depends on the materials used, for control of the characteristics such as light transmittance and sheet resistance of the positive electrode 1 in the range described above.

Further, the negative electrode 2, which is an electrode for injection of electrons into the organic light-emitting layer 4, is preferably made of an electrode material selected from metal, alloy or electrically conductive compound having low work function and a mixture thereof. Use of an electrode material having a work function of 5 eV or less is more preferable. Examples of the electrode materials for the negative electrode 2 include alkali metals, alkali metal halides, alkali metal oxides, alkali-earth metals and the like as well as alloys thereof with other metals, and specific examples thereof include sodium, sodium-potassium alloys, lithium, magnesium, magnesium-silver mixtures, magnesium-indium mixtures, aluminum-lithium alloys, and Ai/LiF mixtures. In addition, aluminum and Al/Al$_2$O$_3$ mixtures, for example, can also be used. Further, an alkali metal oxide, an alkali metal halide or a metal oxide may be used as the underlayer of the negative electrode 2 and one or more layers of conductive materials such as metals formed thereon. Examples thereof include alkali metal/Al laminates, alkali metal halide/alkali-earth metal/Al laminates, alkali metal oxide/Al laminates and the like. Alternatively, a transparent electrode such as ITO or IZO may be used for emission of the light out of the side of the negative electrode 2. The organic matter layer at the interface with the negative electrode 2 may be doped with an alkali or alkali-earth metal such as lithium, sodium, cesium or calcium.

The negative electrode 2 can be prepared, for example, by forming a thin film made of at least one of these electrode materials by a method such as vacuum deposition or sputtering. When light produced in the light-emitting layer 4 is emitted outwards via the positive electrode 1, the negative electrode 2 preferably has a light transmittance of 10% or less. On the contrary when the negative electrode 2 serves as a transparent electrode to allow light to travel outwards via the negative electrode 2 (or when both the positive electrode 1 and the negative electrode 2 allow light to travel outwards), the negative electrode 2 preferably has a light transmittance of 70% or more. The thickness of the negative electrode 2 in the case is normally 500 nm or less, preferably in the range of 100 to 200 nm, although it depends on the materials used, for control of the characteristics, such as light transmittance, of the negative electrode 2.

In such an organic electroluminescent element formed as described above, the multiple light-emitting layers 4 (4*a* and 4*b*) are stacked while an intermediate layer 3 is interposed therebetween. The plurality of light-emitting layers 4 emit light while they are electrically connected via the intermediate layer 3. Hence, it is possible to emit light with high luminance.

In the intermediate layer 3, the first layer 3*b* made of an electron-transporting organic material having a thickness of 0.2 to 20 nm is interposed between the mixed layer 3*a* containing an electron-donating substance and an electron-transporting organic material and the hole-injection layer 3*c*. It is thus possible to suppress easily direct reaction between the mixed layer 3*a* and the hole-injection layer 3*c* and inhibit mixing of the interface between the mixed layer and the hole-injection layer and diffusion of materials of the two layers during operation. It is thus possible to obtain an organic electroluminescent element superior in long-term durability and lifetime characteristics. Use of organic matters and no metal oxide in all layers of the intermediate layer is advantageous, compared to the case when a metal oxide is used, in that there is no difference in the level of refractive index generated and it is also possible to reduce the operation voltage.

Figure 2:
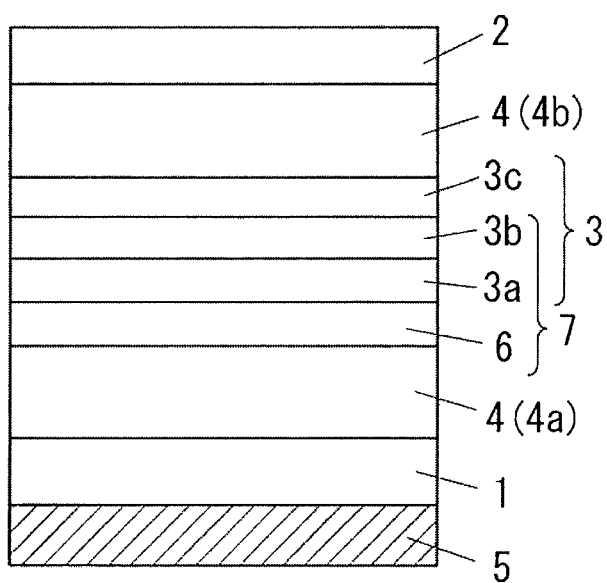
FIG. 2 is a schematic cross-sectional view illustrating the layer structure of an organic electroluminescent element in another embodiment of the present invention.

As shown in FIG. 2, the organic electroluminescent element according to the present invention may include additionally a second layer 6 made of an electron-transporting organic material between the positive electrode 1 and the mixed layer 3*a*. The second layer 6 made of an electron-transporting organic material may be formed above or under the light-emitting layer 4*a*, provided that it is present between the positive electrode 1 and the mixed layer 3*a*. In particular, as shown in FIG. 2, the second layer 6 is preferably interposed between the light-emitting layer 4*a* and the mixed layer 3*a*.

When the electron-transporting organic material contained in the mixed layer 3*a*, the electron-transporting organic material of the first layer 3*b*, and the electron-transporting organic material of the second layer 6 are all the same material (substance), the organic electroluminescent element has further improved long-term durability and lifetime characteristics.

If all electron-transporting organic materials are the same, it is possible, in the vapor deposition operation of the electron-transporting organic material, to reduce the number of times of operation needed for exchanging the vapor deposition source. If the electron-transporting organic material of the mixed layer 3*a* is made of electron-transporting organic material different from those in the first layer 3*b* and the second layer 6, the vapor deposition sources should be replaced in the vapor deposition process. In contrast, if all electron-transporting organic materials are the same, it is possible to form layers of the electron-transporting organic material continuously by vapor deposition and to form a layer of an electron-donating material only in a certain region by vapor deposition. Accordingly, use of an in-line filming process by continuous vapor deposition, such as the process described for example in JP 2002-348659 A, permits preparation of a readily controllable intermediate layer structure and thus is suited for mass production.

The organic electroluminescent element according to the present invention may have a configuration wherein the intermediate layer 3 has an electron-injection layer 7 and a hole-injection layer 3*c* formed in this order from the positive electrode to the negative electrode and the electron-injection layer 7 contains an electron-donating substance and an electron-transporting organic material. In this case, for example in the organic electroluminescent element shown in FIG. 1, the mixed layer 3*a* and the first layer 3*b* correspond to the electron-injection layer 7. Alternatively in the organic electroluminescent element shown in FIG. 2, the second layer 6, the mixed layer 3*a*, and the first layer 3*b* correspond to the electron-injection layer 7. Accordingly, the electron-injection layer 7, as used herein, is a layer including at least a mixed layer 3*a* and a first layer 3*b* formed in this order from the positive electrode to the negative electrode.

When the contents of the electron-donating substance and the electron-transporting organic material are designated respectively as C1 and C2 (C1 and C2 may be based on mass or mol), the value C1/C2 is made larger in the central region than at ends respectively close to the positive electrode and the negative electrode-sided terminal region of the intermediate layer 3.

The end close to the positive electrode and the end close to the negative electrode, and the central region of the intermediate layer 3 are regions described below. That is, the end close to the positive electrode of the intermediate layer 3 is a region 0 to 0.5 nm separated vertically from the end face close to the positive electrode of the intermediate layer 3, while the end close to the negative electrode of the intermediate layer 3 is a region 0 to 0.5 nm separated vertically from the end face close to the negative electrode of the intermediate layer 3. The central region of the intermediate layer 3 is all regions except the ends respectively close to the positive electrode and the negative electrode.

When the organic electroluminescent element has such a configuration described above, it is possible to easily suppress direct reaction between the mixed layer 3*a* and the hole-injection layer 3*c* described below. It is also possible to more easily inhibit mixing of the interface between the mixed layer and the hole-injection layer and diffusion of the materials of the two layers during operation.

Any configuration may be used as the other configuration of the organic electroluminescent element according to the present invention, if it does not impair the advantageous effects of the present invention. For example, as described above, a hole-injection layer, a hole-transporting layer, an electron-transporting layer, an electron-injection layer or the like may be formed, as needed, between the light-emitting layer 4a or 4b and the positive electrode 1 or negative electrode 2, although such layers are not shown in FIG. 1. In such a case, the hole-injection layer and the electron-injection layer are formed as layers other than the intermediate layer 3.

When a hole-transporting layer is formed in the organic electroluminescent element, the material for the layer can be selected, for example, from the group of hole-transporting compounds. Aromatic tertiary amine compounds are used favorably as the compounds. Typical examples thereof include aryl amine compounds, carbazole group-containing amine compounds, and fluorene derivative-containing amine compounds, such as 4,4'-bis[N-(naphthyl)-N-phenyl-amino]biphenyl (α-NPD), N,N'-bis(3-methy phenyl)-(1,1'-biphenyl)-4,4'-diamine (TPD), 2-TNATA, 4,4',4"-tris(N-(3-methylphenyl)-N-phenylamino)triphenylamine (MTDATA), 4,4'-N,N'-dicarbazole-biphenyl (CBP), spiro-NPD, spiro-TPD, spiro-TAD, and TNB, and the like. In addition, any commonly known hole-transporting material can be used.

Alternatively when a hole-injection layer is formed in the organic electroluminescent element, the materials used for the layer include those similar to those used for the hole-transporting layer, tetrafluoro-tetracyano-quinodimethane (F4-TCNQ) and the like, and these materials can be used in combination of two or more.

When such hole-injection layers are formed between the light-emitting layer 4b and the negative electrode 2 and also between the light-emitting layer 4a and the positive electrode 1, the efficiency of hole injection from the hole-injection layer 3c to the hole-transporting layer is improved and the resistance to charge transfer with the first layer 3b decreases. Accordingly, the organic electroluminescent element becomes further improved in long-term durability and lifetime characteristics. In this case too, the improvement is more significant when the value of |LUMO1-LUMO2| is 0.8 eV.

When an electron-transporting layer is formed in the organic electroluminescent element, the materials used for the layer can be selected from the group of electron-transporting compounds. Typical examples of the compounds include metal complexes known as electron-transporting materials such as tris(8-hydroxyquinolinato) aluminum complex (Alq3) and heteroring-containing compounds such as phenanthroline, pyridine, tetrazine, and oxadiazole derivatives and the like. In addition, any commonly known electron-transporting materials can also be used.

EXAMPLES

Hereinafter, the present invention will be described specifically with reference to Examples.

Example 1

Figure 3:
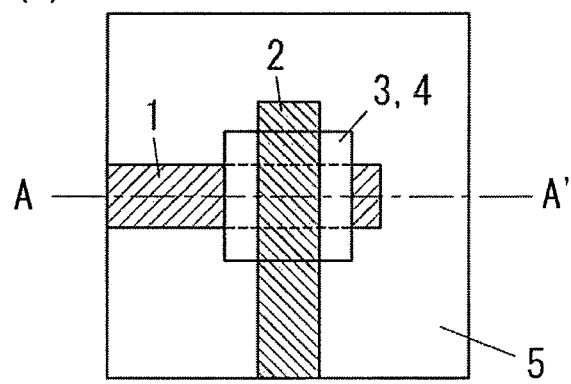
FIGS. 3(a) and 3(b) show the schematic configuration of an organic electroluminescent element prepared in an Example.
Figure 3:
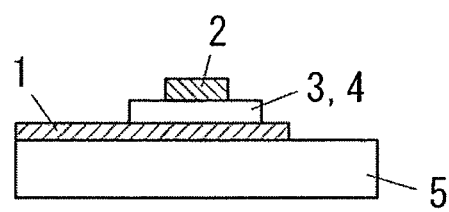
Figure 4:
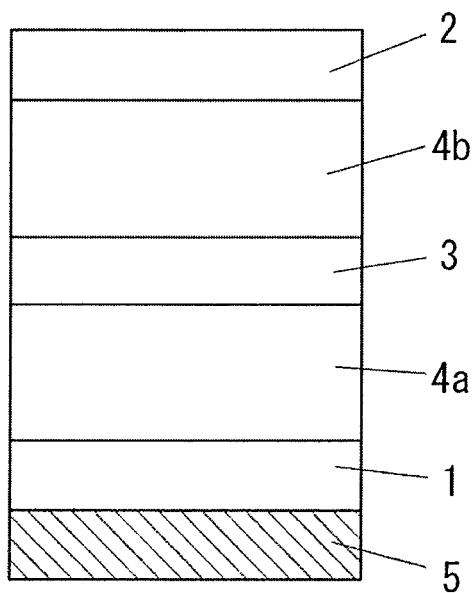
FIG. 4 is a schematic cross-sectional view illustrating the layer structure of an example of a conventional organic electroluminescent element.

First, as shown by the pattern of FIG. 3, a glass substrate 5 having a thickness of 0.7 mm carrying an ITO film, which has a thickness of 150 nm, a width of 5 mm, and a sheet resistance of about 10Ω/□, formed as a positive electrode 1 thereon was prepared. The substrate 5 was previously washed with detergent, ion-exchange water, and acetone respectively for 10 minutes under ultrasonication, vapor-washed with IPA (isopropyl alcohol), dried and additionally subjected to UV/O$_3$ treatment.

The substrate 5 was then fixed in a vacuum evaporator and a film of 4,4'-bis[N-(naphthyl-N-phenyl-amino]biphenyl (α-NPD) and tetrafluoro-tetracyano-quinodimethane (F4-TCNQ) (molar ratio 1:1) having a thickness of 30 nm was formed as a hole-injection layer, on the surface of the positive electrode 1 formed on the substrate 5, by co-vapor deposition in a reduced-pressure atmosphere at $1\times10^{-4}$ Pa or less. Next, a film of α-NPD having a thickness of 30 nm was formed as hole-transporting layer on the co-vapor deposited product by vapor deposition.

A layer of Alq3 and quinacridone (3 mass %) having a thickness of 30 nm was then formed as light-emitting layer 4a by co-vapor deposition on the hole-transporting layer. A film of pure BCP having a thickness of 60 nm was then formed as electron-transporting layer on the light-emitting layer 4.

The intermediate layer 3 was prepared in the following manner. First, a mixed film of Li and BCP at a molar ratio of 1:1 having a thickness of 10 nm was formed on the electron-transporting layer, to give a mixed layer 3a containing an electron-donating substance (Li) and an electron-transporting organic material (BCP).

A film of BCP having a thickness of 5 nm was then formed on the mixed layer 3a, to give a first layer 3b of an electron-transporting organic material.

A film of 1,4,5,8,9,11-hexaazatriphenylene-hexacarbonitrile (HAT-CN6) represented by [Formula 3] having a thickness of 20 nm was formed as hole-injection layer 3c on the first layer 3b, to give the intermediate layer 3.

A film of α-NPD having a thickness of 40 nm was then formed as a hole-transporting layer on the intermediate layer 3 by vapor deposition and a film of Alq3 and quinacridone (7 mass %) having a thickness of 30 nm was formed as light-emitting layer 4b on the hole-transporting layer by co-vapor deposition.

A film of pure BCP having a thickness of 40 nm was then formed as electron-transporting layer on the light-emitting layer 4b and additionally, a film of BCP and Li at a molar ratio of 2:1 having a thickness of 20 nm was formed thereon.

A film of aluminum was then formed as a negative electrode 2 by vapor deposition at a vapor deposition rate of 0.4 nm/s in the shape of 5 mm width and 100 nm thickness, as shown by the pattern of FIG. 3.

In this way, an organic electroluminescent element having the structure shown in FIG. 1, i.e., having two light-emitting layers 4 and an intermediate layer 3 formed between this two light-emitting layers 4 was prepared. The hole-injection layer, the hole-transporting layer, and the electron-transporting layer are not shown in the Figure.

BCP has a LUMO of −3.2 eV, while HAT-CN6 (Formula 3) has a LUMO of −4.0 eV. Thus, the value of |LUMO1-LUMO2| is 0.8 eV.

Example 2

An organic electroluminescent element was prepared in a manner similar to Example 1, except that, in preparation of the mixed layer 3a of intermediate layer 3, a film of BCP having a thickness of 9 nm was first formed on the electron-transporting layer and a film of Li having a thickness of 1 nm was formed thereon, to give a mixed layer 3a containing an electron-donating substance (Li) and an electron-transporting organic material (BCP).

Comparative Example 1

An organic electroluminescent element was prepared in a manner similar to Example 1, except that the first layer 3b of an electron-transporting organic material was not formed.

More specifically, in preparation of the intermediate layer 3 of Comparative Example 1, a film of HAT-CN6 having a thickness of 20 nm was formed directly on the mixed layer 3a, as a layer 3c of the hole-injecting material, without a film of BCP formed on the mixed layer 3a, to give an intermediate layer 3.

Comparative Example 2

An organic electroluminescent element was prepared in a manner similar to Example 2, except that the first layer 3b of an electron-transporting organic material was not formed.

More specifically, in preparation of the intermediate layer 3 of Comparative Example 2, a film of HAT-CN6 having a thickness of 20 nm was formed directly on the mixed layer 3a, as a layer 3c of the hole-injecting material, without a film of BCP formed on the mixed layer 3a, to give an intermediate layer 3.

A current of 4 mA/cm$^2$ was applied to each of the organic electroluminescent elements obtained in Examples and Comparative Examples above and the operation voltage was determined. The period until the luminance decreases from its initial value to 80% of the initial value when a current of 40 mA/cm$^2$ is applied was also determined. Results are summarized in Table 1.

TABLE 1

|  | Operation voltage | Period until luminance decreases to 80% |
|---|---|---|
| Example 1 | 10.2 V | 200 hours |
| Example 2 | 10.4 V | 180 hours |
| Comparative Example 1 | 10.2 V | 110 hours |
| Comparative Example 2 | 10.6 V | 70 hours |

When the operation voltage is compared under the same current, the organic electroluminescent elements of Examples 1 and 2 have operation voltages lower than those of Comparative Examples 1 and 2, and the organic electroluminescent elements of Examples 1 and 2 have lifetimes, as determined by the period until the luminance decreases to 80%, longer than those of Comparative Examples 1 and 2. Further, no defects are observed after application of current. Thus, in the organic electroluminescent elements of Examples 1 and 2, the intermediate layer 3 includes the first layer 3b made of an electron-transporting organic material. Hence, it is possible to easily suppress direct reaction between the mixed layer 3a and the hole-injection layer 3c. It is also possible to easily inhibit mixing of the interface between the mixed layer 3a and the hole-injection layer 3c and diffusion of materials of the layers during operation. For that reason, they showed improved long-term durability and lifetime characteristics.

REFERENCE SIGNS LIST

1 Positive electrode
2 Negative electrode
3 Intermediate layer
3a Mixed layer
3b First layer
3c Hole-injection layer
4 Light-emitting layer
6 Second layer
7 Electron-injection layer

The invention claimed is:

1. An organic electroluminescent element, comprising:
   a plurality of light-emitting layers between positive and negative electrodes; and
   an intermediate layer interposed between the plurality of light emitting layers,
   wherein the intermediate layer includes a mixed layer, a first layer and a hole injection layer which are formed in order from the positive electrode to the negative electrode, the mixed layer containing an electron-donating substance and an electron-transporting organic material, the first layer being made of electron-transporting organic material,
   the first layer has a thickness in a range of 0.2 to 20 nm,
   the hole injection layer consists of an electron-accepting organic material,
   the electron-donating substance includes metal lithium,
   the mixed layer is a mixed film of the metal lithium and the electron-transporting organic material, and
   the mixed film is formed at one time by a vacuum evaporator.

2. The organic electroluminescent element according to claim 1, wherein
   the electron-accepting organic material is 1,4,5,8,9,11-hexaazatriphenylene-hexacarbonitrile.

3. The organic electroluminescent element according to claim 2, further comprising:
   a second layer made of electron-transporting organic material interposed between the positive electrode and the mixed layer,
   wherein the electron transporting organic material contained in the mixed layer, the electron-transporting organic material forming the first layer, and the electron-transporting organic material forming the second layer comprise a same material.

4. The organic electroluminescent element according to claim 1, further comprising:
   a second layer made of electron-transporting organic material interposed between the positive electrode and the mixed layer,
   wherein the electron transporting organic material contained in the mixed layer, the electron-transporting organic material forming the first layer, and the electron-transporting organic material forming the second layer comprise a same material.

5. The organic electroluminescent element according to claim 1, wherein
   the mixed layer is directly on a first one of the plurality of light-emitting layers,
   the first layer is directly on the mixed layer,
   the hole injection layer is directly on the first layer, and
   a second one of the plurality of light-emitting layers is directly on the hole injection layer.

6. The organic electroluminescent element according to claim 1, wherein
   a content of the electron-donating substance in the mixed layer is in a range of 5 to 50 molar percent of the mixed layer, and
   a content of the electron-transporting organic material in the mixed layer is in a range of 95 to 50 molar percent of the mixed layer.

7. The organic electroluminescent element according to claim 1, wherein a molar ratio of the electron-donating substance and the electron-transporting organic material is 1:1.

8. The organic electroluminescent element according to claim 1, wherein
the mixed layer has a thickness in a range of 0.5 to 20 nm.

9. The organic electroluminescent element according to claim 1, wherein
the electron-donating substance is mixed uniformly in the mixed layer.

10. The organic electroluminescent element according to claim 1, wherein
the electron-donating substance is disposed in predetermined regions of the mixed layer.

11. The organic electroluminescent element according to claim 10, wherein
the electron-donating substance is disposed in an intermediate region of the mixed layer.

12. The organic electroluminescent element according to claim 10, wherein
the electron-donating substance is disposed in a region proximate to an interface between the mixed layer and the first layer.

13. The organic electroluminescent element according to claim 1, wherein
the hole injection layer has a thickness in a range of 0.5 to 20 nm.

14. The organic electroluminescent element according to claim 1, further comprising:
a hole-transporting layer formed on the hole injection layer and interposed between the intermediate layer and one of the plurality of light-emitting layers.

15. The organic electroluminescent element according to claim 1, wherein
no metal oxide is used in any layer of the intermediate layer.

16. The organic electroluminescent element according to claim 1, wherein
the plurality of light-emitting layers comprises at least three light-emitting layers, and
the organic electroluminescent element further comprises a plurality of the intermediate layer, each of the plurality of the intermediate layer being interposed between a pair of the plurality of light-emitting layers.

* * * * *